US012218018B2

(12) United States Patent
Troska et al.

(10) Patent No.: US 12,218,018 B2
(45) Date of Patent: Feb. 4, 2025

(54) SEMICONDUCTOR ENCAPSULANT STRENGTH ENHANCER

(71) Applicant: Infineon Technologies AG, Neubiberg (DE)

(72) Inventors: Georg Troska, Froendenberg/Ruhr (DE); Hans Hartung, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 386 days.

(21) Appl. No.: 17/726,045

(22) Filed: Apr. 21, 2022

(65) Prior Publication Data

US 2023/0343661 A1    Oct. 26, 2023

(51) Int. Cl.
| | |
|---|---|
| *H01L 23/26* | (2006.01) |
| *H01L 21/56* | (2006.01) |
| *H01L 23/00* | (2006.01) |
| *H01L 23/053* | (2006.01) |
| *H01L 23/16* | (2006.01) |
| *H01L 23/24* | (2006.01) |
| *H01L 23/29* | (2006.01) |
| *H01L 23/31* | (2006.01) |
| *H01L 23/373* | (2006.01) |
| *H01L 23/498* | (2006.01) |
| *H01L 25/07* | (2006.01) |

(52) U.S. Cl.
CPC ............. *H01L 23/26* (2013.01); *H01L 21/56* (2013.01); *H01L 23/296* (2013.01); *H01L 23/3121* (2013.01)

(58) Field of Classification Search
CPC ....... H01L 23/053; H01L 23/16; H01L 23/26; H01L 23/295–296; H01L 23/3107; H01L 23/3121; H01L 21/56
See application file for complete search history.

(56) References Cited

U.S. PATENT DOCUMENTS

| | | |
|---|---|---|
| 5,019,892 A | 5/1991 | Grabbe |
| 5,373,417 A | 12/1994 | Barrett et al. |
| 6,037,658 A | 3/2000 | Brodsky et al. |
| 6,195,267 B1 | 2/2001 | MacDonald et al. |

(Continued)

FOREIGN PATENT DOCUMENTS

| | | |
|---|---|---|
| DE | 102007055537 A1 | 5/2008 |
| DE | 102020114952 A1 | 12/2021 |

(Continued)

*Primary Examiner* — Mohsen Ahmadi
(74) *Attorney, Agent, or Firm* — Murphy, Bilak & Homiller, PLLC (57) ABSTRACT

A semiconductor module includes a power electronics carrier including a structured metallization layer disposed on an electrically insulating substrate, a power semiconductor die mounted on the power electronics carrier, a housing that surrounds an interior volume over the power electronics carrier, a reinforcing structure contained within the interior volume and including a textured surface that is accessible by fluid, a volume of curable encapsulant disposed within the interior volume and encapsulating the power semiconductor die, wherein the reinforcing structure is embedded within the volume of curable encapsulant such that the textured surface adheres to the encapsulant, and wherein the reinforcing structure has a tensile strength that is greater than a tensile strength of the curable encapsulant.

19 Claims, 5 Drawing Sheets

(56) References Cited

U.S. PATENT DOCUMENTS

| | | |
|---|---|---|
| 6,329,259 B1 | 12/2001 | Johansson |
| 6,625,025 B1 | 9/2003 | Duxbury et al. |
| 6,676,796 B2 | 1/2004 | Pinter et al. |
| 8,937,380 B1 | 1/2015 | Vaupel et al. |
| 2010/0084162 A1 | 4/2010 | Lin |
| 2012/0168296 A1 | 7/2012 | Ida et al. |
| 2012/0223442 A1 | 9/2012 | Goetz et al. |
| 2013/0056883 A1 | 3/2013 | Furukawa |
| 2013/0139998 A1 | 6/2013 | Hayashi et al. |
| 2013/0199295 A1 | 8/2013 | Hoefer et al. |
| 2014/0138707 A1 | 5/2014 | Miki et al. |
| 2014/0138841 A1 | 5/2014 | Hosseini et al. |
| 2015/0001700 A1* | 1/2015 | Hartung ............... H01L 23/564 438/126 |
| 2015/0008570 A1* | 1/2015 | Arai .................... H01L 23/4334 257/687 |
| 2015/0060932 A1 | 3/2015 | Huang et al. |
| 2016/0262292 A1 | 9/2016 | Kuk et al. |
| 2018/0166363 A1 | 6/2018 | Heppner et al. |
| 2019/0218346 A1* | 7/2019 | Nakagawa ............ C08K 5/5419 |
| 2019/0267332 A1 | 8/2019 | Sikka et al. |
| 2020/0120825 A1 | 4/2020 | Manninen et al. |
| 2020/0343107 A1 | 10/2020 | Trichy Rengarajan |
| 2021/0068304 A1 | 3/2021 | Strader et al. |
| 2021/0400838 A1* | 12/2021 | Nottelmann ............ H05K 3/303 |
| 2022/0051960 A1 | 2/2022 | Nomann et al. |

FOREIGN PATENT DOCUMENTS

| | | |
|---|---|---|
| EP | 3349551 A1 | 7/2018 |
| EP | 3029443 B1 | 5/2019 |
| EP | 3831871 A1 | 6/2021 |
| JP | S62104044 A | 5/1987 |
| JP | S62154653 A | 7/1987 |
| JP | H11274482 A | 10/1999 |
| JP | 2012109451 A | 6/2012 |
| JP | 2013004766 A | 1/2013 |
| TW | 201809126 A | 3/2018 |
| WO | 2017085131 A1 | 5/2017 |

* cited by examiner

SEMICONDUCTOR ENCAPSULANT STRENGTH ENHANCER

BACKGROUND

Many different applications such as automotive and industrial applications utilize power modules. Power modules may include multiple power devices in a single package, with these power devices being arranged as a power conversion circuit such as a single and multi-phase half-wave rectifier, single and multi-phase full-wave rectifier, voltage regulator, inverter, etc. Modern power modules are designed for highly efficient operation that can improve the electric power dissipation of an electrical system.

In many applications, semiconductor device arrangements such as power modules and semiconductor packages must be able to withstand harsh environmental conditions, e.g., substantial temperature variations, moisture, etc. Moreover, many semiconductor dies operate at high temperatures, which results in substantial thermal cycling of the device. These conditions may negatively affect the operation of the device and may cause complete failure. There is a need to produce electrically isolated and environmentally hardened semiconductor device arrangements such as power modules and semiconductor packages with increased reliability and durability.

SUMMARY

A semiconductor module is disclosed. According to an embodiment, the semiconductor module comprises a power electronics carrier comprising a structured metallization layer disposed on an electrically insulating substrate, a power semiconductor die mounted on the power electronics carrier, a housing that surrounds an interior volume over the power electronics carrier, a reinforcing structure contained within the interior volume and comprising a textured surface that is accessible by fluid, a volume of curable encapsulant disposed within the interior volume and encapsulating the power semiconductor die, wherein the reinforcing structure is embedded within the volume of curable encapsulant such that the textured surface adheres to the encapsulant, and wherein the reinforcing structure has a tensile strength that is greater than a tensile strength of the curable encapsulant.

A semiconductor device is disclosed. According to an embodiment, the semiconductor device comprises an encapsulant body of electrically insulating encapsulant material, a semiconductor die encapsulated within the encapsulant body, and a reinforcing structure contained within the encapsulant body and arranged between the semiconductor die and an outer surface of the encapsulant body, wherein the reinforcing structure comprises a textured surface area that is accessible by fluid, wherein the reinforcing structure is embedded within the encapsulant body such that the textured surface adheres to the encapsulant material, and wherein the reinforcing structure is formed from a material with a tensile strength that is greater than a tensile strength of the encapsulant material.

A method of producing a semiconductor module is disclosed. According to an embodiment, the method comprises providing a power electronics carrier comprising a structured metallization layer disposed on an electrically insulating substrate, mounting a power semiconductor die on the power electronics carrier, providing a housing that surrounds an interior volume over the power electronics carrier, providing a reinforcing structure within the interior volume that comprises a textured surface area, and providing a curable encapsulant disposed within the interior volume that encapsulates the power semiconductor die, wherein the reinforcing structure is embedded within volume of curable encapsulant such that the textured surface area adheres to the encapsulant, and wherein the reinforcing structure has a tensile strength that is greater than a tensile strength of the curable encapsulant.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2, which includes FIGS. 2A and 2B, illustrates the effect of embedding a reinforcing structure within a curable encapsulant.

FIG. 3, which includes

FIG. 4, which includes FIGS. 4A and 4B, illustrates a method of producing a semiconductor module with a reinforcing structure embedded within a volume of curable encapsulant.

FIG. 5, which includes FIGS. 5A and 5B, illustrates a semiconductor package with a reinforcing structure embedded within an encapsulant body, according to an embodiment.

DETAILED DESCRIPTION

Embodiments of a semiconductor device with a reinforcing structure embedded within a volume of encapsulant material are described herein. The reinforcing structure has a tensile strength that is greater than a tensile strength of the encapsulant. Moreover, the reinforcing structure has a textured surface that adheres to the encapsulant, thereby creating a mechanically coupled relationship. As a result, the reinforcing structure advantageously fortifies the encapsulant material, thereby preventing the occurrence of voids or cracks in the encapsulant material. Moreover, the reinforcing structure may be configured to counteract thermal expansion and compression of the encapsulant material, thereby reducing the possibility of delamination of voids occurring between the encapsulant material the encapsulated surfaces.

Figure 1:
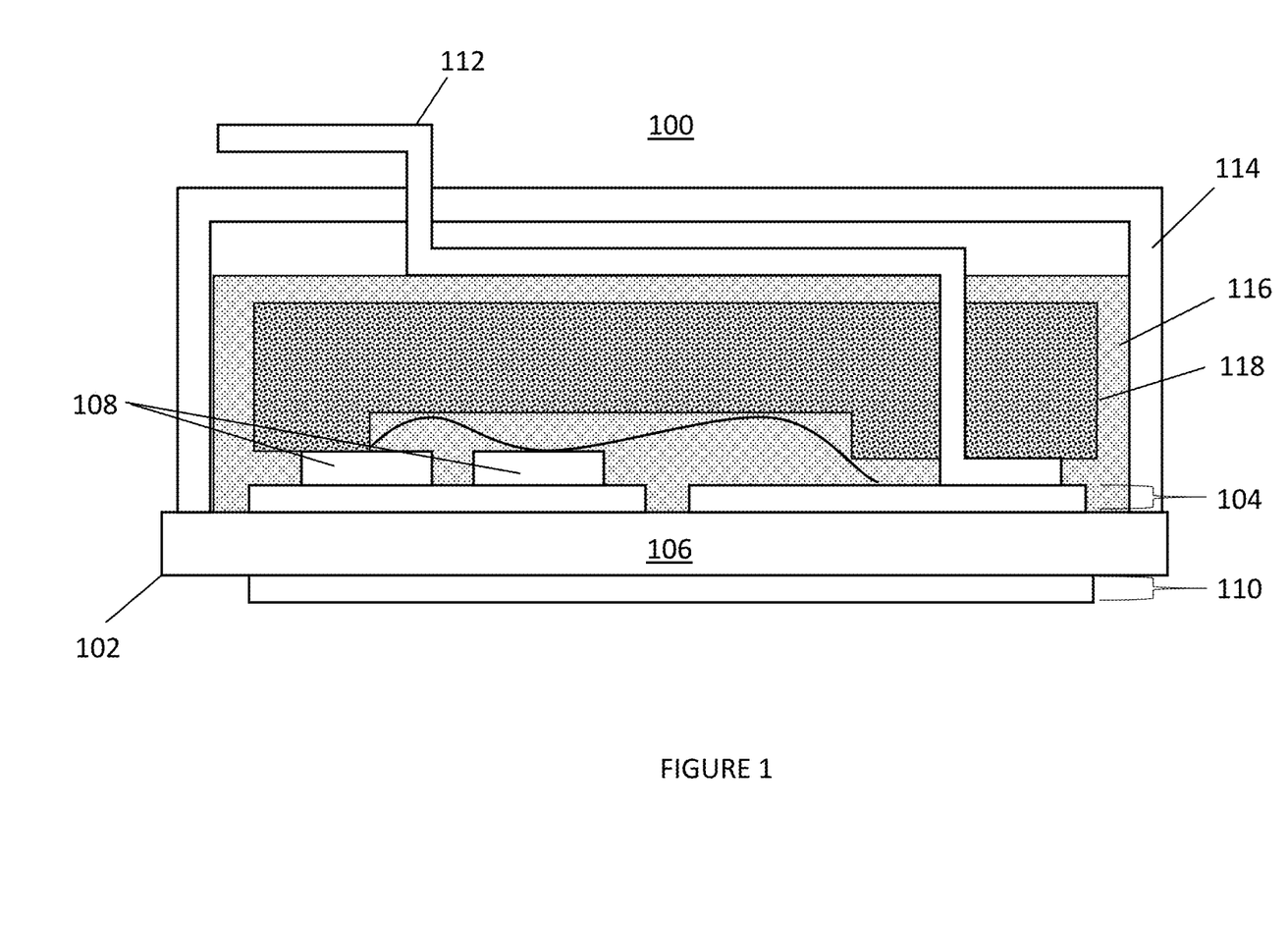
FIG. 1 illustrates a semiconductor module with a reinforcing structure embedded within a volume of curable encapsulant, according to an embodiment.

Referring to FIG. 1, a semiconductor module 100 is depicted, according to an embodiment. The semiconductor module 100 comprises a carrier 102. The carrier 102 is a substrate that is configured to accommodate the mounting of multiple power semiconductor devices thereon and to efficiently extract heat away from these power semiconductor devices during operation. The carrier 102 may be configured to be directly mounted to a support structure, such as a heat sink. Alternatively, the carrier 102 may be attached to a base plate, wherein the base plate is configured to mount the module to an external structure, such as a heat sink. The carrier 102 comprises a structured metallization layer 104 disposed on an electrically insulating substrate 106. The electrically insulating substrate 106 may include a ceramic material such as $Al_2O_3$ (Alumina) AlN (Aluminium Nitride), etc. The structured metallization layer 104 comprises a plurality of pads that are disposed on the electrically insulating substrate 106 and are electrically isolated from one another. The pads are dimensioned to accommodate the mounting of semiconductor dies 108 or passive elements thereon. Additionally, the pads can form part of an electrical interconnect structure that connects two or more devices together. The carrier 102 may additionally comprise a second metallization layer 110 disposed on a rear side of the electronics carrier 102. The second metallization layer 110 may be a continuous layer that is used to thermally couple the semiconductor module 100 to a cooling apparatus, such as a heat sink. The first structured metallization layer 104 and the second metallization layer 110 may comprise or be plated with any one or more of Cu, Ni, Ag, Au, Pd, Pt, NiV, NiP, NiNiP, NiP/Pd, Ni/Au, NiP/Pd/Au, or NiP/Pd/AuAg.

According to an embodiment, the carrier 102 is a power electronics carrier, such as a Direct Copper Bonding (DCB) substrate, a Direct Aluminum Bonding (DAB) substrate, or an Active Metal Brazing (AMB) substrate. Further, a power electronics carrier may be an Insulated Metal Substrate (IMS). An Insulated Metal Substrate generally comprises a dielectric insulation layer comprising (filled) materials such as epoxy resin or polyimide, for example. The carrier may also be a printed circuit board (PCB). In that case, the electrically insulating substrate 106 may comprise a resin material such as FR-4.

The semiconductor module 100 comprises semiconductor dies 108 mounted on the carrier 102. According to an embodiment, at least one of the semiconductor dies 108 is configured as a power semiconductor die. A power semiconductor die refers to a single device that is rated to accommodate voltages of at least 100 V (volts), and more typically voltages of 600 V, 1200 V or more and/or is rated to accommodate currents of at least 1 A, and more typically currents of 10 A, 50 A, 100 A or more. Examples of power semiconductor dies include discrete power diodes and discrete power transistor dies, e.g., MOSFETs (Metal Oxide Semiconductor Field Effect Transistors), IGBTs (Insulated Gate Bipolar Transistors), and HEMTs (High Electron Mobility Transistors), etc. Separately or in combination, the semiconductor dies 108 mounted on the carrier 102 may comprise other types of devices, e.g., logic devices, custom circuits, controllers, sensing devices, passive elements, etc.

The semiconductor module 100 may be configured as a power converter or power inverter. For example, the semiconductor dies 108 may be power transistors that form the high-side switch and low-side switch of a half-bridge circuit. The power module may additionally comprise one or more of the semiconductor dies 108 being driver dies that control a switching operation of the half-bridge circuit. The power module may additionally include passive devices, e.g., capacitors, inductors, resistors, etc. Electrical interconnection between the various elements on the power electronics substrate 106 may be effectuated using metal interconnect elements, e.g., clips, ribbons, bond wires, etc., that are soldered to the devices and/or metal pads. Additionally, the semiconductor module 100 may comprise additional metal structures, such as tabs or busbar structures (not shown) that deliver fixed voltages to the various devices mounted on the on the carrier 102.

The semiconductor module 100 comprises terminal connectors 112 extending from the carrier 102 to a location that is externally accessible. The terminal connectors 112 may be formed from an electrically conductive metal that and may be soldered to or otherwise attached to the carrier 102. The terminal connectors 112 may form external points of electrical contact to the devices mounted on the carrier 102. Generally speaking, these terminal connectors 112 may have a variety of different configurations and may be adapted to mate with a particular receptacle, e.g., a PCB. The terminal connectors 112 may have a variety of geometric configurations different from what is shown. For example, at least some of the terminal connectors 112 may be configured as press-fit connectors.

The semiconductor module 100 comprises a housing 114 with sidewalls that surround an interior volume over the carrier 102. In this context, the interior volume refers to a three-dimensional space that is bounded on one side by the upper surface of the carrier 102. Thus, the housing 114 may form boundaries that in addition to the carrier 102 enclose the interior volume that is over the carrier 102. The sidewalls of the housing 114 may be attached directly to the carrier 102 as shown. Alternatively, in another embodiment (not shown), the semiconductor module 100 may comprise a separate metal baseplate, and the carrier 102 and the sidewalls of the housing 114 may each be mounted on this metal baseplate. The housing 114 may also include a cover section extending over the interior volume. Such a cover section could be integrally formed with the sidewalls, or removably attached thereto. The housing 114 may be formed from a plastic material, for example.

The semiconductor module 100 comprises a volume of encapsulant 116 disposed within the interior volume of the housing 114. The encapsulant 116 protects the components arranged inside the housing 114, and in particular encapsulates the semiconductor dies 108 and associated electrical conditions, thereby protecting these elements from exterior environmental conditions and mechanical damage. Generally speaking, the encapsulant 116 can comprise any of a wide variety of materials that are used in electronics applications to protect semiconductor dies 108. According to an embodiment, the encapsulant 116 is a dielectric material that electrically isolates the components from one another, and from the potential of a baseplate or other supporting structure to which the carrier 102 is mounted. For example, the encapsulant 116 may have a dielectric strength of at least 15 kV/mm and/or a specific resistance of at least $2*10^{15}$ Ωcm or at least $2.5*10^{15}$ Ωcm.

According to an embodiment, the encapsulant 116 is formed from a curable encapsulant material. A curable encapsulant material is a material that can exist in a fluid or gelatinous state and can then be subsequently hardened to form a rigid and/or non-penetrative body. For example, the curable encapsulant 116 can be in a fluid or gelatinous state during an encapsulation process wherein it is flowed into the interior volume of the housing 114. Subsequently, the curable encapsulant 116 can be hardened to form a substantially rigid structure that encapsulates and protects the components arranged inside the housing 114. The hardening may occur through external environmental conditions, e.g., being placed in a heating and/or drying atmosphere and/or exposure to UV radiation or through the application of an external agent. Examples of curable encapsulant materials include epoxy materials, thermosetting plastics, polymers, resins, and pre-preg materials (pre impregnated fiber) such as, FR-4. According to an embodiment, the curable encapsulant 116 comprises a dielectric gel. More particularly, the curable encapsulant 116 may be a potting compound, such as a silicone-based potting compound.

The semiconductor module 100 additionally comprises a reinforcing structure 118 within the interior volume that is embedded within the volume of encapsulant 116. The reinforcing structure 118 comprises a textured surface. In this context, a textured surface refers to a surface that is intentionally formed with regular or irregular deviations from a single plane and therefore has a greater surface area than a nominally planar surface. The textured surface is accessible by fluid, meaning that the textured surface is either an outer surface of the reinforcing structure 118 or is an internal surface of the reinforcing structure 118 that can be accessed by a liquid, e.g., a liquified encapsulant 116 by the above-described encapsulation process. In the latter case, the internal surface of the reinforcing structure 118 can be accessed by an open pathway in the reinforcing structure 118 and/or by diffusion of fluid. The textured surface may interact with the liquified encapsulant material so as to form an adhesive bond between the two.

According to an embodiment, the reinforcing structure 118 has a tensile strength that is greater than a tensile strength of the curable encapsulant 116. In this context, the tensile strength of the curable encapsulant 116 refers to the tensile strength of the curable encapsulant 116 in the cured or hardened state. Tensile strength refers to a measurement of the maximum stress that a material can withstand while being stretched or pulled before breaking or undergoing permanent deformation. The tensile strength of the reinforcing structure 118 and the curable encapsulant 116 can be measured by standardized engineering tests and equipment.

According to an embodiment, the reinforcing structure 118 has a coefficient of thermal expansion that is equal to or less than the coefficient of thermal expansion of the curable encapsulant 116. For example, the curable encapsulant 116 may have a coefficient of thermal expansion in the range of $200-600 \times 10^{-6}$ M/K, which may correspond to the coefficient of thermal expansion of electronics potting compounds. The coefficient of thermal expansion of the reinforcing structure 118, which is a function of the underlying materials which form the reinforcing structure 118, may be less than $200 \times 10^{-6}$ M/K and/or may be less than that of the material which forms the curable encapsulant 116.

Figure 2A:
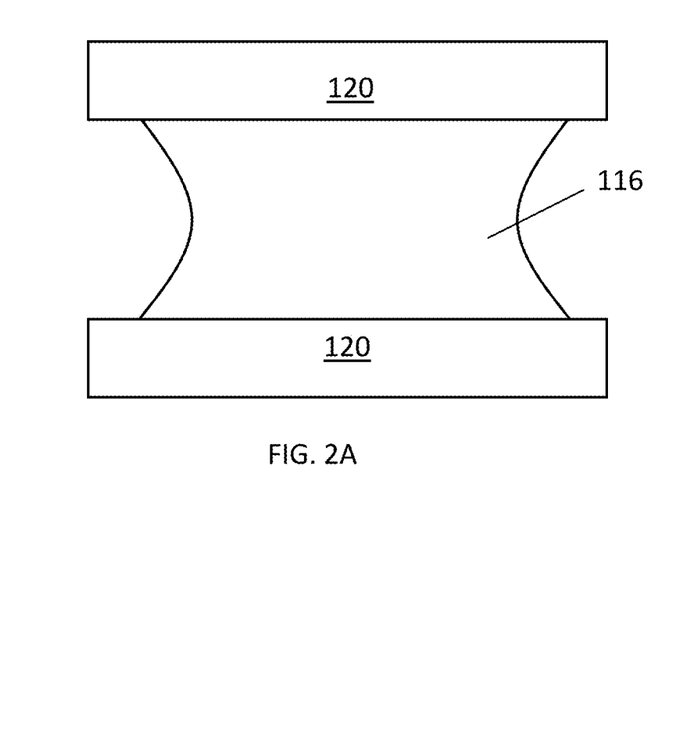
FIG. 2A illustrates an assembly without a reinforcing structure embedded within a curable encapsulant.

Referring to FIG. 2A, an assembly comprising a volume of the curable encapsulant material 116 without the reinforcing structure 118 embedded therein is shown. The encapsulant material 116 is arranged between two fixed plane parallel surfaces 120 which have a lower coefficient of thermal expansion than the encapsulant 116 material. The fixed plane parallel surfaces 120 may correspond to interior surfaces within the housing 114. As shown, the encapsulant material 116 is substantially warped in a central location that is between the fixed plane parallel surfaces 120. This warpage results from thermal cycling of the encapsulant 116 material, e.g., from initial curing of the encapsulant 116 material or from subsequent thermal cycling of the encapsulant 116 during operation of the encapsulated devices. The thermal expansion and compression in the encapsulant material 116 associated with these temperature variations creates a significant amount of tensile stress in the encapsulant material 116 that is particularly concentrated in the central part of the volume, and at interior surfaces where tensile stresses are not perpendicular thereto, e.g., at protrusions or components extending therefrom.

Figure 2B:
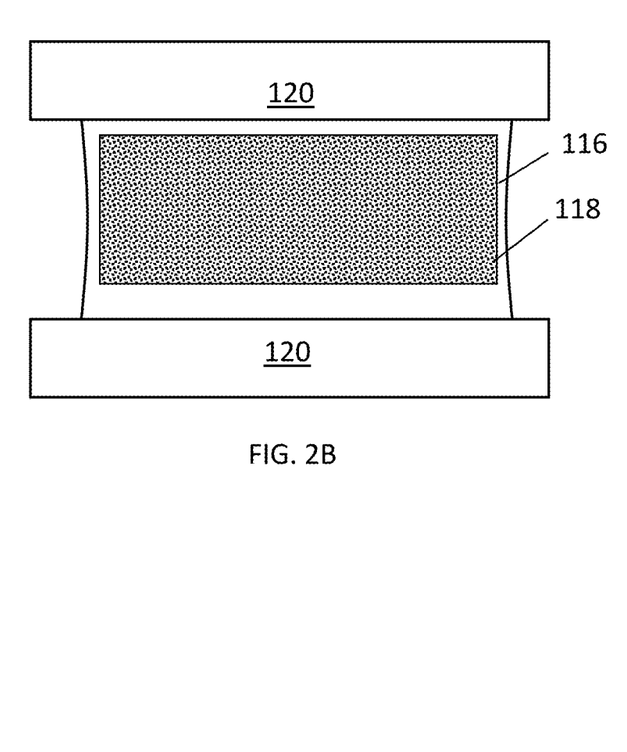
FIG. 2B illustrates the assembly with a reinforcing structure embedded within the curable encapsulant.

FIG. 2B illustrates the curable encapsulant material 116 arranged between two fixed plane parallel surfaces 120 and additionally with the reinforcing structure 118 embedded within the curable encapsulant 116. As can be seen, the presence of the reinforcing structure 118 substantially mitigates the tensile stress in the material and reduces the amount of warpage in the material. The reinforcing structure 118 provides a mechanism that more homogeneously distributes tensile stress that arises in the encapsulant material 116 throughout the entire volume of the encapsulant material 116. This is due to the increased tensile strength of the material of the reinforcing structure 118 and the mechanical coupling of the textured surface to the curable encapsulant material 116. Moreover, the reinforcing structure 118 can provide a mechanism that counteracts the thermal expansion and compression of the curable encapsulant material 116. This is due to the lower coefficient of thermal expansion of the reinforcing structure 118.

Referring again to FIG. 1, the reinforcing structure 118 enhances the efficacy of the encapsulant material 116 and reliability of the semiconductor module 100 in the following way. The encapsulant material 116 may initially be flowed at a temperature of between 50° C. and 200° C. and subsequently brought to room temperature. Separately or in combination, during operation, the heat generating elements of the semiconductor module 100 such as the semiconductor dies 108 and/or passive elements may reach operating temperatures of 50° C., 75° C., 100° C., 150° C., 200° C. or more. The increased tensile strength of the encapsulant material 116 mitigates the possibility of cracks or breaks forming in the encapsulant material 116 at any time during these thermal cycles, thereby ensuring reliable encapsulation of the devices. Separately or in combination, the reinforcing structure 118 reduces the degree to which the encapsulant material 116 compresses or expands during these thermal cycles. This reduces the possibility of voiding or delamination between the interior surfaces of the semiconductor module 100, such as the surfaces of the metallization and the semiconductor dies 108 mounted on the carrier 102. As a result, the reinforcing structure 118 may eliminate the need to apply specific adhesion promotors to the surfaces of the metallization and the semiconductor dies 108 prior to encapsulation. Separately or in combination, the reinforcing structure 118 may allow for smaller design rule spacings between the internal elements of the power module, such as between busbar structures, interconnect elements, connectors, etc.

Figure 3A:
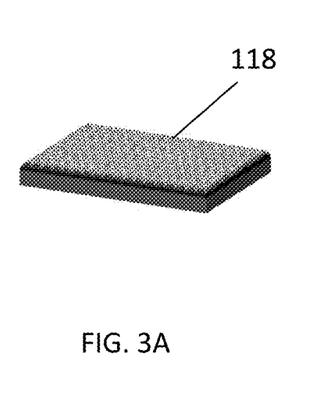
FIGS. 3A, 3B and 3C, illustrates a reinforcing structure, according to various embodiments.

Referring to FIG. 3A, one embodiment of the reinforcing structure 118 is shown. In this embodiment, the reinforcing structure 118 is a cubic-shaped object that comprises a network of cells. That is, the reinforcing structure 118 occupies a fixed volume and comprises a plurality of cells that are contained within the interior volume of the reinforcing structure 118. The cells are cavities or pores in the reinforcing structure 118 that can accommodate a volume of fluid therein.

According to an embodiment, the reinforcing structure 118 is configured such that the network of cells of the reinforcing structure 118 form a three-dimensional grid. This means that the cells are arranged along a first plane and are arranged along a second plane that is orthogonal to a first plane. Examples of reinforcing structures 118 which form a form a three-dimensional grid include foams and sponges. Other examples of reinforcing structures 118 which form a three-dimensional grid include technical filters and three-dimensional textiles. The three-dimensional grid arrangement is well-suited to homogenously distribute the tensile stress throughout the entire volume of the encapsulant material 116. This is because the arrangement of the cells relegates the area of tensile stress to evenly distributed and mechanically decoupled locations.

According to an embodiment, a reinforcing structure 118 that comprises a network of cells is configured such that there is open fluid ingress and egress to the network of cells. That is, a fluid, such as a liquefied encapsulant 116, can reach the interior cells though a network of channels or pores. Examples of reinforcing structures 118 that are configured such that there is open fluid ingress and egress to the network of cells include open-cell sponges and foams, as well as technical filters and three-dimensional textiles. Alternatively, it may be possible for the reinforcing structure 118 to compose a closed network of cells wherein a liquefied encapsulant 116 reaches the cells by diffusion, depending on factors such as the thickness and material composition of the reinforcing structure 118 and the viscosity of the encapsulant 116.

Figure 3B:
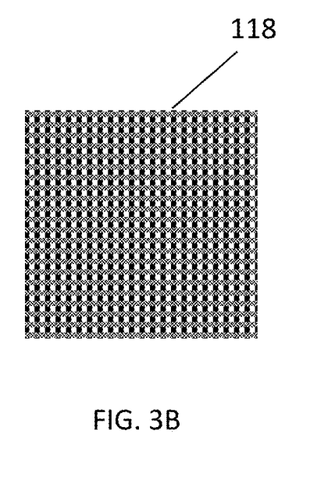

Referring to FIG. 3B, another embodiment of the reinforcing structure 118 is shown. In this embodiment, the reinforcing structure 118 is a woven fabric. The woven fabric comprises strands of dielectric material that are woven together in transverse directions. Different to the three-dimensional grid described above, the woven fabric may not necessarily comprise cells. In this case, the surface interaction between the woven fabric and the curable encapsulant material 116 creates adherence and mechanically couples the curable encapsulant 116 to the reinforcing structure 118. Multiple sheets of the woven fabric may be used together in a single volume of the curable encapsulant material 116 to enhance the structural integrity.

Figure 3C:
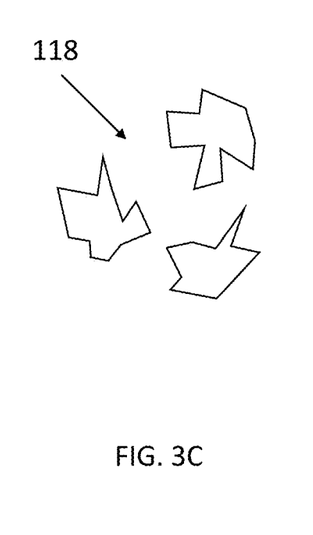

Referring to FIG. 3C, another embodiment of the reinforcing structure 118 is shown. In this embodiment, the reinforcing structure 118 is a plurality of disconnected filler elements. Each of the disconnected filler elements may be flake-like structures with a textured surface. The disconnected filler elements may comprise perforations or may be a continuous object. The geometry of the disconnected filler elements can be random and/or non-identical as between two filler elements. The disconnected filler elements can be immersed in the encapsulant 116. In the aggregate, the incorporation of a plurality of disconnected filler elements into the curable encapsulant 116 can enhance the tensile strength of the encapsulant 116 in comparison to a volume of the encapsulant 116 without the filler elements.

In any of the above-described examples, the material which forms the reinforcing structure 118 can be any material that can create the necessary geometry while also conforming to tensile strength requirements and/or coefficient of thermal expansion requirements, as the case may be. The material which forms the reinforcing structure 118 can be a dielectric material such that the encapsulant 116 with the reinforcing structure 118 has the necessary electrical isolation properties. Examples of materials that can satisfy this criterion include thermoplastic materials, epoxy materials duroplastics, elastomers and silicone materials, for example.

The reinforcing structures 118 disclosed with reference to FIGS. 3A, 3B and 3C may be combined within one another in a single volume of curable encapsulant 116 to enhance. For example, a cubic-shaped object as described with reference to FIG. 3A may be immersed in a curable encapsulant 116 comprising the disconnected filler elements as described with reference to FIG. 3C mixed therein. In another example, a woven fabric as described with reference to FIG. 3B may be immersed in a curable encapsulant 116 comprising the disconnected filler elements as described with reference to FIG. 3C mixed therein.

Figure 4A:
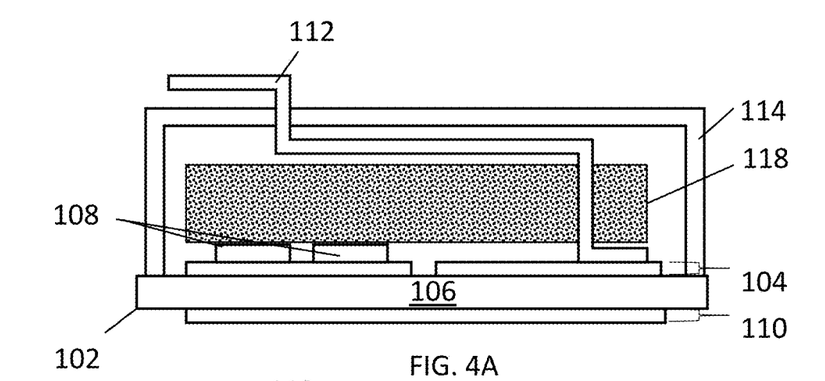
FIG. 4A illustrates the assembly before flowing encapsulant.

Referring to FIG. 4A, a method of producing a semiconductor module 100 comprises providing the carrier 102 comprising a structured metallization layer 104 disposed on an electrically insulating substrate 106, mounting a semiconductor die 108 on the carrier 102 and providing a housing 114 that surrounds an interior volume over the carrier 102. The semiconductor die 108 can be mounted on the structured metallization layer 104 using a conductive adhesive such as solder. The electrical interconnect elements, e.g., bond wires, clips, ribbons, etc., may be attached using conductive adhesives such as solder or other bonding methods such as welding technologies. Subsequently, the reinforcing structure 118 can be placed within the interior volume of the housing 114, e.g., in the case of a cubic-shaped object that comprises a network of cells or a woven fabric. The reinforcing structure 118 may be designed to fit around the electrical interconnect elements or the electrical interconnect elements may deform the reinforcing structure 118. For example, as shown, the reinforcing structure 118 may comprise a slit or opening to accommodate wire bonds (as shown in FIG. 1), while being planar and flush against the structured metallization layer 104 in different cross-sections (as shown in FIGS. 4A and 4B).

Figure 4B:
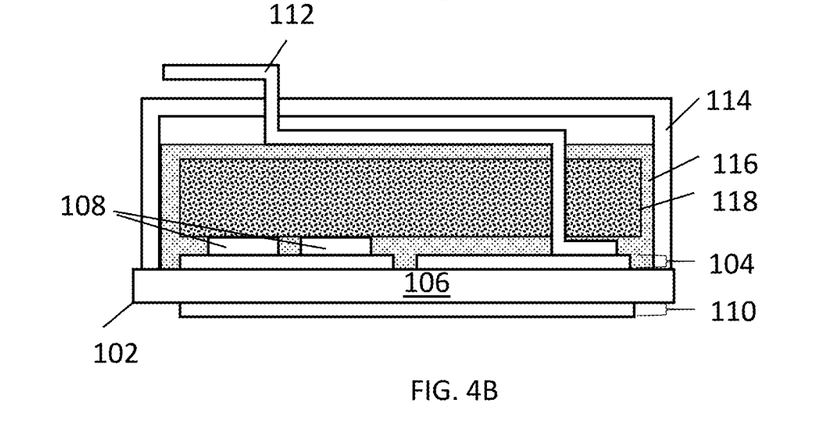
FIG. 4B illustrates the assembly after flowing encapsulant.

Referring to FIG. 4B, the curable encapsulant 116 is provided within the interior volume such that the semiconductor die 108 is encapsulated and such that the reinforcing structure 118 is embedded within the encapsulant 116. This process may comprise flowing the curable encapsulant 116 into the interior volume in a liquified state so as to cover the semiconductor die 108 and interact with the textured surface area of the reinforcing structure 118. Subsequently, the encapsulant 116 is hardened such that the reinforcing structure 118 is inseparable from the curable encapsulant 116.

In an embodiment wherein the reinforcing structure 118 is a cubic-shaped object that comprises a network of cells, the encapsulation process may be carried out such that the cells absorb the liquified encapsulant 116. To this end, the cells may be dimensioned to permit the liquefied state encapsulant 116 to flow into them during the flowing of the curable encapsulant 116. The ability of the cells to absorb the liquefied state encapsulant 116 can be a function of the volume of the cells, the degree of open ingress and egress between the cells and the exterior environment, and the viscosity of the liquefied state encapsulant 116. Accordingly, these variables may be selected to ensure that the liquefied state encapsulant 116 is mostly absorbed (e.g., at least 75% of capacity) in a commercially reasonable about of time. Separately or in combination, the atmospheric conditions may be selected to enhance absorption. For example, the curable encapsulant 116 can be flowed by a vacuum potting process whereby interior volume of the housing 114 is in a very low-pressure atmosphere. This removes air from the cells of the reinforcing structure 118 and allows for easier displacement of the liquified encapsulant 116 into the cells.

According to another technique a structure comprising the reinforcing structure 118 and an encapsulant 116 such as a curable dielectric gel is hardened is prepared outside of the interior volume. This prepared structure with the hardened encapsulant 116 is then arranged within the interior volume. Subsequently, a second liquified encapsulant 116 is flowed into the interior volume to fill the areas between the prepared structure and the housing 114.

Figures 5A, 5B:
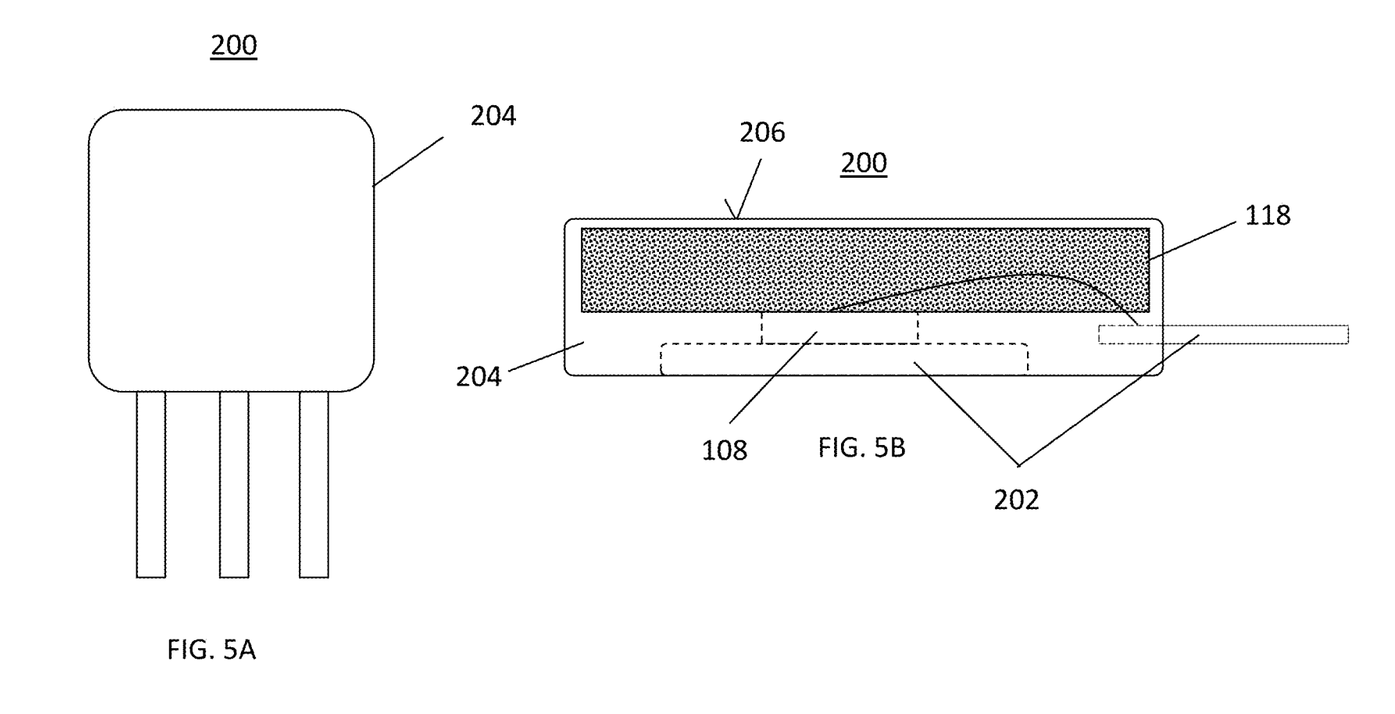
FIG. 5A illustrates an outer view of the semiconductor package.
FIG. 5B illustrates an interior view of the semiconductor package.

Referring to FIG. 5, a semiconductor package 200 is depicted, according to an embodiment. Generally speaking, the semiconductor package 200 can have a wide variety of configurations, e.g., discrete device package, integrated device, etc. The semiconductor package 200 can comprise a metal lead frame 202 with a die pad and a plurality of leads extending away from the die pad. A semiconductor die 108 is mounted on the lead frame 202 and is electrically connected to the leads using electrical interconnect elements, e.g., wire bonds as shown.

The semiconductor package 200 comprises an encapsulant body 204 of encapsulant material 116. The encapsulant body 204 can be formed by a molding process such as injection molding, transfer molding, compression molding, etc. According to these techniques, a lead frame assembly comprising the lead frame 202 with the semiconductor die mounted 108 thereon is arranged into a molding tool, a mold compound is injected into the molding tool and is subsequently cured to form the encapsulant body 204. Generally speaking, the mold compound can comprise dielectric materials such as epoxy, thermosetting plastic, polymer, resin, etc.

The semiconductor device additionally comprises a reinforcing structure 118 contained within the encapsulant body 204 and arranged between the semiconductor die 108 and an outer surface 206 of the encapsulant body 204. The reinforcing structure 118 can comprise any one or combination of the previously described embodiments. As shown, the reinforcing structure 118 is a cubic-shaped object that comprises a network of cells. This reinforcing structure 118 can be arranged over the semiconductor die prior to the mold injection process such that a liquified encapsulant material flows into and is absorbed by the reinforcing structure 118 in a similar manner as previously described. The reinforcing structure 118 advantageously mitigates cracking and mechanical failure as well as the formation of voids of delamination within the semiconductor package 200 in the same way as previously described.

A reinforcing structure 118 as described herein can be incorporated into a variety of different types of curable materials used in electronics applications. Examples of these curable materials include adhesive compounds, sealings, electrically conductive gels. In the case of an electrically conductive curable materials, the material composition of the reinforcing structure 118 can be selected accordingly.

Although the present disclosure is not so limited, the following numbered examples demonstrate one or more aspects of the disclosure.

Example 1

A semiconductor module, comprising: a power electronics carrier comprising a structured metallization layer disposed on an electrically insulating substrate; a power semiconductor die mounted on the power electronics carrier; a housing comprising sidewalls that surround an interior volume over the power electronics carrier; a reinforcing structure contained within the interior volume and comprising a textured surface that is accessible by fluid; a volume of curable encapsulant disposed within the interior volume and encapsulating the power semiconductor die, wherein the reinforcing structure is embedded within the volume of curable encapsulant such that the textured surface adheres to the encapsulant, wherein the reinforcing structure has a tensile strength that is greater than a tensile strength of the curable encapsulant, and wherein the reinforcing structure comprises a material with a coefficient of thermal expansion that is equal to or less than a coefficient of thermal expansion of the encapsulant.

Example 2

The semiconductor module of example 1, wherein the reinforcing structure comprises a network of cells, and wherein the cells at least partially absorb the encapsulant.

Example 3

The semiconductor module of example 2, wherein the cells form a three-dimensional grid.

Example 4

The semiconductor module of example 3, wherein the reinforcing structure is an foam or sponge.

Example 5

The semiconductor module of example 3, wherein the reinforcing structure comprises any one or more of: duroplastics, elastomers, and silicone.

Example 6

The semiconductor module of example 1, wherein the reinforcing structure comprises any one or more of: a woven fabric, and a plurality of disconnected filler elements.

Example 7

The semiconductor module of example 1, wherein the curable encapsulant and the reinforcing structure are each formed from dielectric materials.

Example 8

The semiconductor module of example 7, wherein the curable encapsulant is a silicone-based potting compound.

Example 9

The semiconductor module of example 1, wherein the reinforcing structure has a lower coefficient of thermal expansion than the encapsulant.

Example 10

A semiconductor device, comprising: an encapsulant body of electrically insulating encapsulant material; a semiconductor die encapsulated within the encapsulant body; and a reinforcing structure contained within the encapsulant body and arranged between the semiconductor die and an outer surface of the encapsulant body, wherein the reinforcing structure comprises a textured surface area that is accessible by fluid, wherein the reinforcing structure is embedded within the encapsulant body such that the textured surface adheres to the encapsulant material, and wherein the reinforcing structure has a tensile strength that is greater than a tensile strength of the curable encapsulant, and wherein the reinforcing structure comprises a material with a coefficient of thermal expansion that is equal to or less than a coefficient of thermal expansion of the encapsulant.

Example 11

The semiconductor device of example 10, wherein the reinforcing structure comprises a network of cells, wherein the cells at least partially absorb the encapsulant, and wherein the cells form a three-dimensional grid.

Example 12

A method of producing a semiconductor module, the method comprising: providing a power electronics carrier comprising a structured metallization layer disposed on an electrically insulating substrate; mounting a power semiconductor die on the power electronics carrier; providing a housing comprising sidewalls that surround an interior volume over the power electronics carrier; providing a reinforcing structure within the interior volume that comprises a textured surface area; and providing a curable encapsulant disposed within the interior volume that encapsulates the power semiconductor die, wherein the reinforcing structure is embedded within volume of curable encapsulant such that the textured surface area adheres to the encapsulant, wherein the reinforcing structure has a tensile strength that is greater than a tensile strength of the curable encapsulant, and wherein the reinforcing structure comprises a material with a coefficient of thermal expansion that is equal to or less than a coefficient of thermal expansion of the encapsulant.

Example 13

The method of example 12, wherein the reinforcing structure is provided within the interior volume before providing the curable encapsulant, and wherein providing the curable encapsulant comprises: flowing the curable encapsulant in a liquified state into the interior volume so as to cover the power semiconductor die and interact with the textured surface area; and hardening the encapsulant such that the reinforcing structure is inseparable from the curable encapsulant.

Example 14

The method of example 13, wherein the reinforcing structure comprises a network of cells, and wherein the cells are dimensioned to permit the liquefied state encapsulant to flow into them during the flowing of the curable encapsulant.

Example 15

The method of example 14, wherein the cells form a three-dimensional grid.

Example 16

The method of example 13, wherein the reinforcing structure distributes the curable encapsulant into a plurality of distributed regions that permit compression and expansion of the encapsulant during thermal cycling.

Example 17

The method of example 16, wherein the power semiconductor die has a maximum operating temperature of at least 75° C.

Example 18

The method of example 12, wherein the curable encapsulant comprises a dielectric gel.

Example 19

The semiconductor module of example 19, wherein the dielectric gel is a silicone-based potting compound.

The semiconductor dies 108 disclosed herein can be formed in a wide variety of device technologies that utilize a wide variety of semiconductor materials. Examples of such materials include, but are not limited to, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), etc.

The semiconductor dies 108 disclosed herein may be configured as a vertical device, which refers to a device that conducts a load current between opposite facing main and rear surfaces of the die. Alternatively, the semiconductor dies 108 may be configured as a lateral device, which refers to a device that conducts a load current parallel to a main surface of the die.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A semiconductor module, comprising:
a power electronics carrier comprising a structured metallization layer disposed on an electrically insulating substrate;
a power semiconductor die mounted on the power electronics carrier;
a housing comprising sidewalls that surround an interior volume over the power electronics carrier;
a reinforcing structure contained within the interior volume and comprising a textured surface that is accessible by fluid;
a volume of curable encapsulant disposed within the interior volume and encapsulating the power semiconductor die,
wherein the reinforcing structure is embedded within the volume of curable encapsulant such that the textured surface adheres to the encapsulant,
wherein the reinforcing structure has a tensile strength that is greater than a tensile strength of the curable encapsulant, and wherein the reinforcing structure comprises a material with a coefficient of thermal expansion that is equal to or less than a coefficient of thermal expansion of the encapsulant.

2. The semiconductor module of claim 1, wherein the reinforcing structure comprises a network of cells, and wherein the cells at least partially absorb the encapsulant.

3. The semiconductor module of claim 2, wherein the cells form a three-dimensional grid.

4. The semiconductor module of claim 3, wherein the reinforcing structure is an foam or sponge.

5. The semiconductor module of claim 3, wherein the reinforcing structure comprises any one or more of: duroplastics, elastomers, and silicone.

6. The semiconductor module of claim 1, wherein the reinforcing structure comprises any one or more of: a woven fabric, and a plurality of disconnected filler elements.

7. The semiconductor module of claim 1, wherein the curable encapsulant and the reinforcing structure are each formed from dielectric materials.

8. The semiconductor module of claim 7, wherein the curable encapsulant is a silicone-based potting compound.

9. The semiconductor module of claim 1, wherein the reinforcing structure has a lower coefficient of thermal expansion than the encapsulant.

10. A semiconductor device, comprising:
an encapsulant body of electrically insulating encapsulant material;
a semiconductor die encapsulated within the encapsulant body; and
a reinforcing structure contained within the encapsulant body and arranged between the semiconductor die and an outer surface of the encapsulant body,
wherein the reinforcing structure comprises a textured surface area that is accessible by fluid,
wherein the reinforcing structure is embedded within the encapsulant body such that the textured surface adheres to the encapsulant material, and
wherein the reinforcing structure has a tensile strength that is greater than a tensile strength of the curable encapsulant, and
wherein the reinforcing structure comprises a material with a coefficient of thermal expansion that is equal to or less than a coefficient of thermal expansion of the encapsulant.

11. The semiconductor device of claim 10, wherein the reinforcing structure comprises a network of cells, wherein the cells at least partially absorb the encapsulant, and wherein the cells form a three-dimensional grid.

12. A method of producing a semiconductor module, the method comprising:

providing a power electronics carrier comprising a structured metallization layer disposed on an electrically insulating substrate;
mounting a power semiconductor die on the power electronics carrier;
providing a housing comprising sidewalls that surround an interior volume over the power electronics carrier;
providing a reinforcing structure within the interior volume that comprises a textured surface area; and
providing a curable encapsulant disposed within the interior volume that encapsulates the power semiconductor die,
wherein the reinforcing structure is embedded within volume of curable encapsulant such that the textured surface area adheres to the encapsulant, and
wherein the reinforcing structure has a tensile strength that is greater than a tensile strength of the curable encapsulant,
wherein the reinforcing structure comprises a material with a coefficient of thermal expansion that is equal to or less than a coefficient of thermal expansion of the encapsulant.

13. The method of claim 12, wherein the reinforcing structure is provided within the interior volume before providing the curable encapsulant, and wherein providing the curable encapsulant comprises:
flowing the curable encapsulant in a liquified state into the interior volume so as to cover the power semiconductor die and interact with the textured surface area; and
hardening the encapsulant such that the reinforcing structure is inseparable from the curable encapsulant.

14. The method of claim 13 wherein the reinforcing structure comprises a network of cells, and wherein the cells are dimensioned to permit the liquefied state encapsulant to flow into them during the flowing of the curable encapsulant.

15. The method of claim 14, wherein the cells form a three-dimensional grid.

16. The method of claim 13, wherein the reinforcing structure distributes the curable encapsulant into a plurality of distributed regions that permit compression and expansion of the encapsulant during thermal cycling.

17. The method of claim 16, wherein the power semiconductor die has a maximum operating temperature of at least 75° C.

18. The method of claim 12, wherein the curable encapsulant comprises a dielectric gel.

19. The semiconductor module of claim 18, wherein the dielectric gel is a silicone-based potting compound.

* * * * *

UNITED STATES PATENT AND TRADEMARK OFFICE
CERTIFICATE OF CORRECTION

| | | |
|---|---|---|
| PATENT NO. | : 12,218,018 B2 | |
| APPLICATION NO. | : 17/726045 | |
| DATED | : February 4, 2025 | |
| INVENTOR(S) | : G. Troska et al. | |

It is certified that error appears in the above-identified patent and that said Letters Patent is hereby corrected as shown below:

In the Claims

Column 13, Line 11 (Claim 4) change "an foam" to -- a foam --

Signed and Sealed this
First Day of April, 2025

Coke Morgan Stewart
*Acting Director of the United States Patent and Trademark Office*